United States Patent
Srirattana et al.

(10) Patent No.: US 10,553,925 B2
(45) Date of Patent: Feb. 4, 2020

(54) TUNABLE ELECTROMAGNETIC COUPLER AND MODULES AND DEVICES USING SAME

(71) Applicant: SKYWORKS SOLUTIONS, INC., Woburn, MA (US)

(72) Inventors: Nuttapong Srirattana, Lexington, MA (US); Sriram Srinivasan, Bedford, MA (US); Zhiyang Liu, Dunstable, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 16/285,662

(22) Filed: Feb. 26, 2019

(65) Prior Publication Data
US 2019/0190112 A1 Jun. 20, 2019

Related U.S. Application Data

(63) Continuation of application No. 15/498,724, filed on Apr. 27, 2017, now Pat. No. 10,249,930.
(Continued)

(51) Int. Cl.
*H04B 1/40* (2015.01)
*H01P 5/18* (2006.01)
(Continued)

(52) U.S. Cl.
CPC ............... *H01P 5/18* (2013.01); *H01P 5/187* (2013.01); *H03F 3/19* (2013.01); *H03F 3/245* (2013.01);
(Continued)

(58) Field of Classification Search
CPC . H04B 1/40; H03F 220/294; H03F 2200/451; H03F 3/60; H03F 3/245;
(Continued)

(56) References Cited

U.S. PATENT DOCUMENTS 3,611,199 A 10/1971 Safran
3,868,594 A 2/1975 Cornwell et al.
(Continued)

FOREIGN PATENT DOCUMENTS

EP 2503701 A2 9/2012
JP S62-159502 A 7/1987
(Continued)

OTHER PUBLICATIONS

Chen at al., "A High-Directivity Microstrip Directional Coupler With Feedback Compensation", 2002 IEEE MTT-S International Microwave Symposium Digest, issued in 2002, pp. 101-104.
(Continued)

*Primary Examiner* — April G Gonzales
(74) *Attorney, Agent, or Firm* — Lando & Anastasi, LLP

(57) ABSTRACT

An electromagnetic coupler includes a first transmission line connecting an input port to an output port and a second transmission line adjacent the first transmission line and connecting a coupled port to an isolation port. The electromagnetic coupler provides a coupled signal at the coupled port, which is representative of an input signal at the input port. The amplitude of the coupled signal is related to the amplitude of the input signal by a coupling factor. A tuning element is electromagnetically coupled to at least one of the first and second transmission lines. An adjustable impedance is coupled between the tuning element and a reference node. Varying resistive impedance components causes an adjustment to the coupling factor and reactive impedance components provide frequency filtering effects.

20 Claims, 12 Drawing Sheets

Related U.S. Application Data

(60) Provisional application No. 62/484,940, filed on Apr. 13, 2017, provisional application No. 62/463,010, filed on Feb. 24, 2017, provisional application No. 62/329,385, filed on Apr. 29, 2016.

(51) Int. Cl.
| | |
|---|---|
| *H03H 7/01* | (2006.01) |
| *H03F 3/60* | (2006.01) |
| *H03F 3/19* | (2006.01) |
| *H03F 3/24* | (2006.01) |
| *H03H 7/06* | (2006.01) |
| *H03H 7/38* | (2006.01) |

(52) U.S. Cl.
CPC ............ *H03F 3/60* (2013.01); *H03H 7/0153* (2013.01); *H03H 7/06* (2013.01); *H03H 7/38* (2013.01); *H04B 1/40* (2013.01); *H03F 2200/294* (2013.01); *H03F 2200/451* (2013.01)

(58) Field of Classification Search
CPC ... H03F 3/19; H03H 7/38; H03H 7/06; H03H 7/0153; H01P 5/187; H01P 5/18
USPC .......................................................... 455/77
See application file for complete search history.

(56) References Cited

U.S. PATENT DOCUMENTS

| | | | |
|---|---|---|---|
| 4,460,875 A | 7/1984 | Harman | |
| 4,677,399 A | 6/1987 | Le Dain et al. | |
| 4,764,740 A | 8/1988 | Meyer | |
| 5,038,112 A | 8/1991 | O'Neill | |
| 5,222,246 A | 6/1993 | Wolkstein | |
| 5,276,411 A | 1/1994 | Woodin, Jr. et al. | |
| 5,363,071 A | 11/1994 | Schwent et al. | |
| 5,487,184 A | 1/1996 | Nagode | |
| 5,625,328 A | 4/1997 | Coleman, Jr. | |
| 5,745,016 A | 4/1998 | Salminen | |
| 5,767,753 A | 6/1998 | Ruelke | |
| 5,903,820 A | 5/1999 | Hagstrom | |
| 6,020,795 A | 2/2000 | Kim | |
| 6,078,299 A | 6/2000 | Scharfe, Jr. | |
| 6,108,527 A | 8/2000 | Urban et al. | |
| 6,329,880 B2 | 12/2001 | Akiya | |
| 6,496,708 B1 | 12/2002 | Chan et al. | |
| 6,559,740 B1 | 5/2003 | Schulz et al. | |
| 6,771,141 B2 | 8/2004 | Iida et al. | |
| 6,803,818 B2* | 10/2004 | van Amerom | H03G 3/3042 330/144 |
| 6,972,640 B2 | 12/2005 | Nagamori et al. | |
| 7,042,309 B2 | 5/2006 | Podell | |
| 7,230,316 B2 | 6/2007 | Yamazaki et al. | |
| 7,236,069 B2* | 6/2007 | Puoskari | H01P 1/2053 333/202 |
| 7,305,223 B2 | 12/2007 | Liu et al. | |
| 7,319,370 B2 | 1/2008 | Napijalo | |
| 7,336,142 B2 | 2/2008 | Vogel | |
| 7,493,093 B2 | 2/2009 | Boerman et al. | |
| 7,538,635 B2 | 5/2009 | Fukuda et al. | |
| 7,546,089 B2 | 6/2009 | Bellantoni | |
| 7,966,140 B1 | 6/2011 | Gholson, III et al. | |
| 7,973,358 B2 | 7/2011 | Hanke et al. | |
| 8,115,234 B2* | 2/2012 | Nakajima | H01L 27/0207 257/194 |
| 8,175,554 B2 | 5/2012 | Camuffo et al. | |
| 8,248,302 B2 | 8/2012 | Tsai et al. | |
| 8,289,102 B2 | 10/2012 | Yamamoto et al. | |
| 8,315,576 B2 | 11/2012 | Jones | |
| 8,334,580 B2* | 12/2012 | Sakurai | H01L 23/66 257/508 |
| 8,417,196 B2 | 4/2013 | Kitching et al. | |
| 8,526,890 B1 | 9/2013 | Chien et al. | |
| 8,606,198 B1 | 12/2013 | Wright | |
| 8,633,761 B2* | 1/2014 | Lee | H03F 1/56 327/108 |
| 8,761,026 B1* | 6/2014 | Berry | H01P 5/12 327/403 |
| 8,810,331 B2* | 8/2014 | Gu | H03H 7/0153 333/17.1 |
| 9,014,647 B2 | 4/2015 | Kitching et al. | |
| 9,214,967 B2 | 12/2015 | Reisner et al. | |
| 9,225,382 B2* | 12/2015 | Khlat | H04B 1/44 |
| 9,356,330 B1 | 5/2016 | Donoghue et al. | |
| 9,425,835 B2* | 8/2016 | Seckin | H04B 1/0475 |
| 9,496,902 B2* | 11/2016 | Srirattana | H04B 1/40 |
| 9,553,617 B2* | 1/2017 | Srirattana | H04B 1/40 |
| 9,634,371 B2* | 4/2017 | Swarup | H01P 5/028 |
| 9,755,670 B2* | 9/2017 | Chen | H04B 1/04 |
| 2002/0097100 A1* | 7/2002 | Woods | H03B 5/1876 331/99 |
| 2002/0113601 A1* | 8/2002 | Swank, II | G01R 27/06 324/637 |
| 2002/0113666 A1 | 8/2002 | Yamazaki et al. | |
| 2002/0139975 A1 | 10/2002 | Lewis et al. | |
| 2003/0214365 A1 | 11/2003 | Adar et al. | |
| 2004/0127178 A1 | 7/2004 | Kuffner | |
| 2004/0201526 A1* | 10/2004 | Knowles | H01Q 1/38 343/700 MS |
| 2005/0017821 A1 | 1/2005 | Sawicki | |
| 2005/0040912 A1 | 2/2005 | Pelz | |
| 2005/0146394 A1 | 7/2005 | Podell | |
| 2005/0170794 A1 | 8/2005 | Koukkari et al. | |
| 2005/0239421 A1 | 10/2005 | Kim et al. | |
| 2006/0232359 A1 | 10/2006 | Fukuda et al. | |
| 2007/0082642 A1* | 4/2007 | Hattori | H03H 9/542 455/286 |
| 2007/0159268 A1 | 7/2007 | Podell | |
| 2008/0036554 A1 | 2/2008 | Krausse et al. | |
| 2008/0055187 A1* | 3/2008 | Tamura | H01P 1/15 343/876 |
| 2008/0056638 A1 | 3/2008 | Glebov et al. | |
| 2008/0070519 A1 | 3/2008 | Okabe | |
| 2008/0112466 A1 | 5/2008 | Sasaki | |
| 2009/0134953 A1 | 5/2009 | Hunt et al. | |
| 2009/0195335 A1 | 8/2009 | Wahl et al. | |
| 2009/0278624 A1 | 11/2009 | Tsai et al. | |
| 2009/0280755 A1 | 11/2009 | Camuffo et al. | |
| 2009/0322313 A1 | 12/2009 | Zhang et al. | |
| 2011/0057746 A1 | 3/2011 | Yamamoto et al. | |
| 2011/0063044 A1 | 3/2011 | Jones | |
| 2011/0148548 A1* | 6/2011 | Uhm | H01P 1/20345 333/205 |
| 2011/0199166 A1 | 8/2011 | Carrillo-Ramirez | |
| 2011/0254637 A1* | 10/2011 | Manssen | H03H 7/40 333/2 |
| 2011/0279192 A1 | 11/2011 | Nash et al. | |
| 2011/0298559 A1 | 12/2011 | Kitching et al. | |
| 2012/0019332 A1 | 1/2012 | Hino et al. | |
| 2012/0019335 A1 | 1/2012 | Hoang et al. | |
| 2012/0062333 A1 | 3/2012 | Ezzeddine et al. | |
| 2012/0071123 A1 | 3/2012 | Jones et al. | |
| 2012/0195351 A1* | 8/2012 | Banwell | H04B 1/525 375/219 |
| 2012/0243579 A1 | 9/2012 | Premakanthan et al. | |
| 2013/0005284 A1 | 1/2013 | Dalipi | |
| 2013/0113575 A1 | 5/2013 | Easter | |
| 2013/0194054 A1 | 8/2013 | Presti | |
| 2013/0207741 A1 | 8/2013 | Presti | |
| 2013/0241668 A1 | 9/2013 | Tokuda | |
| 2013/0293316 A1 | 11/2013 | Kitching et al. | |
| 2013/0307635 A1 | 11/2013 | Kase et al. | |
| 2014/0152253 A1* | 6/2014 | Ozaki | H02J 5/005 320/108 |
| 2014/0213201 A1* | 7/2014 | Reisner | H04B 1/04 455/113 |
| 2014/0266499 A1 | 9/2014 | Noe | |
| 2014/0368293 A1 | 12/2014 | Mukaiyama | |
| 2015/0002239 A1 | 1/2015 | Tanaka | |
| 2015/0042412 A1* | 2/2015 | Imbornone | H01P 5/18 333/112 |
| 2015/0043669 A1 | 2/2015 | Ella et al. | |

(56) References Cited

U.S. PATENT DOCUMENTS

| | | | |
|---|---|---|---|
| 2015/0048910 A1* | 2/2015 | LaFountain | H01H 9/04 335/207 |
| 2015/0072632 A1* | 3/2015 | Pourkhaatoun | H04B 1/0458 455/127.2 |
| 2015/0091668 A1 | 4/2015 | Solomko et al. | |
| 2015/0200437 A1 | 7/2015 | Solomko et al. | |
| 2015/0249485 A1* | 9/2015 | Ouyang | H04B 5/0081 455/41.1 |
| 2015/0270821 A1* | 9/2015 | Natarajan | H03H 7/20 455/78 |
| 2015/0326202 A1* | 11/2015 | Nicholls | H04B 1/006 327/553 |
| 2015/0349742 A1 | 12/2015 | Chen et al. | |
| 2015/0372366 A1 | 12/2015 | Frye | |
| 2016/0025928 A1 | 1/2016 | Onawa | |
| 2016/0028147 A1 | 1/2016 | Srirattana et al. | |
| 2016/0028420 A1 | 1/2016 | Srirattana et al. | |
| 2016/0043458 A1 | 2/2016 | Sun et al. | |
| 2016/0065167 A1 | 3/2016 | Granger-Jones et al. | |
| 2016/0079649 A1 | 3/2016 | Ilkov et al. | |
| 2016/0079650 A1 | 3/2016 | Solomko et al. | |
| 2016/0172737 A1 | 6/2016 | Srirattana et al. | |
| 2016/0172738 A1 | 6/2016 | Srirattana et al. | |
| 2016/0172739 A1 | 6/2016 | Srirattana et al. | |
| 2016/0172740 A1 | 6/2016 | Srirattana et al. | |
| 2016/0268994 A1 | 9/2016 | Granger-Jones et al. | |
| 2016/0344430 A1* | 11/2016 | Srirattana | H04B 1/40 |
| 2016/0344431 A1* | 11/2016 | Srirattana | H04B 1/40 |
| 2016/0373146 A1* | 12/2016 | Manssen | H03H 7/40 |
| 2017/0026020 A1* | 1/2017 | Solomko | H01P 5/184 |
| 2017/0033428 A1 | 2/2017 | Ootsuka et al. | |
| 2017/0063425 A1 | 3/2017 | Khlat et al. | |
| 2017/0085245 A1* | 3/2017 | Srirattana | H04B 1/40 |
| 2017/0141802 A1* | 5/2017 | Solomko | G01R 27/06 |

FOREIGN PATENT DOCUMENTS

| | | |
|---|---|---|
| JP | H01274502 A | 11/1989 |
| JP | H08505750 A | 6/1996 |
| JP | 2000-077915 A | 3/2000 |
| JP | 2001127664 A | 5/2001 |
| JP | 2011040978 A | 2/2011 |
| JP | 2013126067 A | 6/2013 |
| KR | 20040037465 A | 5/2004 |
| KR | 20110118289 A | 10/2011 |
| KR | 20120007790 A | 1/2012 |
| WO | 2005018451 A1 | 3/2005 |
| WO | 2015020927 A2 | 2/2015 |
| WO | 2015134979 A1 | 9/2015 |

OTHER PUBLICATIONS

International Search Report and Written Opinion from corresponding International Application No. PCT/US2017/029800 dated Jul. 18, 2017.

* cited by examiner

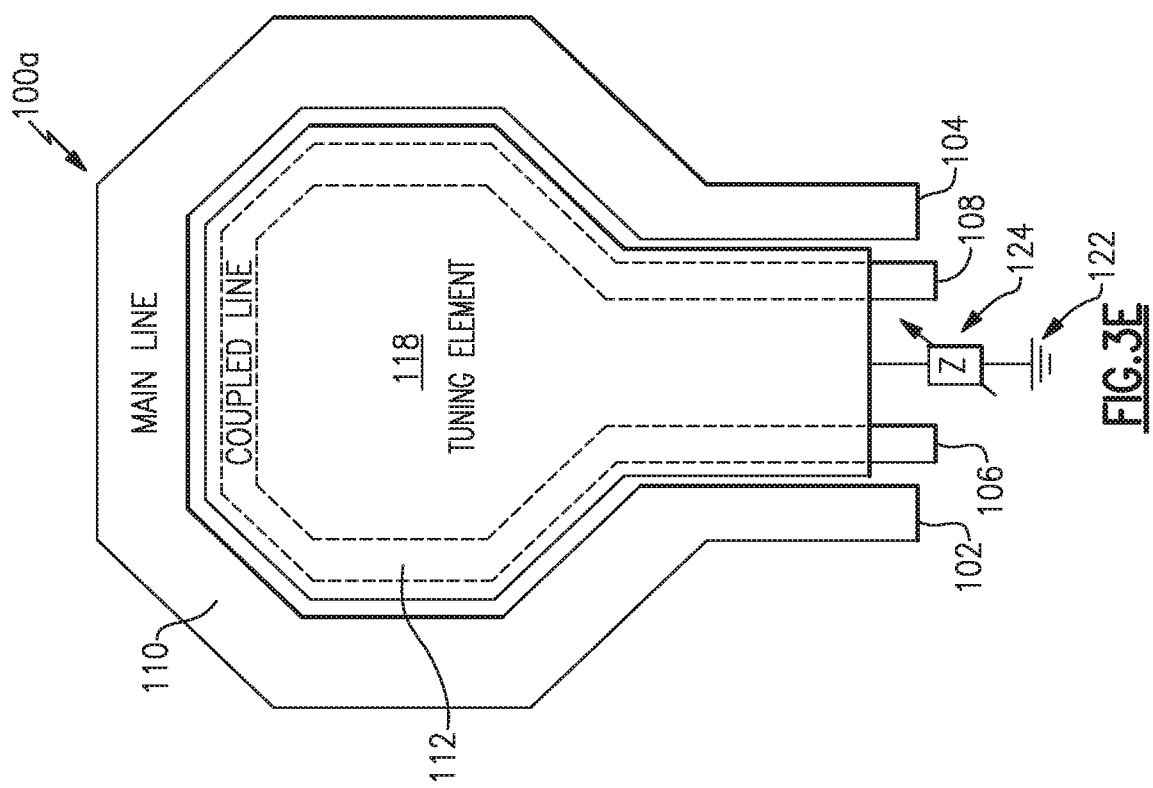
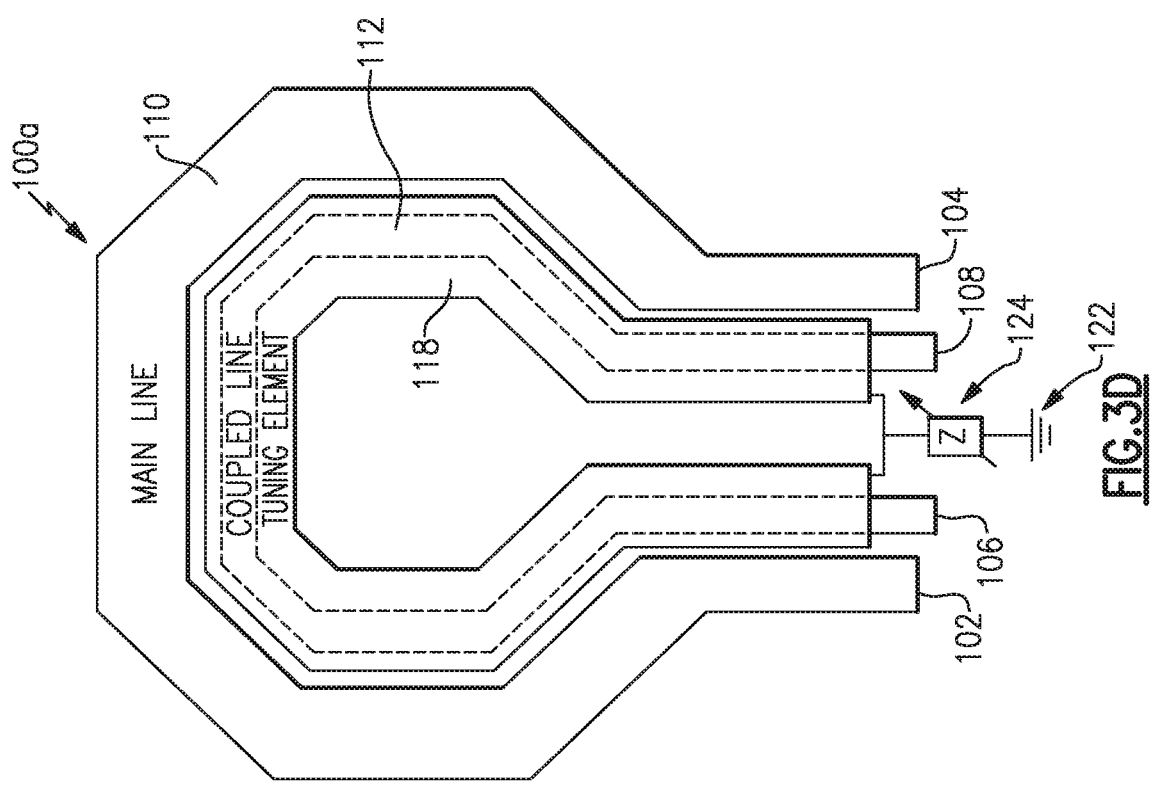

TUNABLE ELECTROMAGNETIC COUPLER AND MODULES AND DEVICES USING SAME

CROSS REFERENCE TO RELATED APPLICATIONS

This application claims the benefit under 35 U.S.C. § 120 of co-pending U.S. application Ser. No. 15/498,724 filed on Apr. 27, 2017, which claims the benefits under 35 U.S.C. § 119(e) and PCT Article 8 to U.S. Provisional Patent Application No. 62/329,385 filed on Apr. 29, 2016, and to U.S. Provisional Patent Application No. 62/463,010 filed on Feb. 24, 2017, and to U.S. Provisional Patent Application No. 62/484,940 filed on Apr. 13, 2017, each of which is incorporated herein by reference in its entirety for all purposes.

BACKGROUND

Directional couplers are widely used in front end module (FEM) products, such as in radio transceivers, wireless handsets, and the like. For example, a directional coupler can be used to detect and monitor electromagnetic (EM) output power. Additionally, when a radio frequency (RF) signal generated by an RF source is provided to a load, such as to an antenna, a portion of the RF signal can be reflected back from the load. An EM coupler can be included in a signal path between the RF source and the load to provide an indication of forward RF power of the RF signal traveling from the RF source to the load and/or an indication of reverse RF power reflected back from the load. EM couplers include, for example, directional couplers, bi-directional couplers, multi-band couplers (e.g., dual band couplers), and the like.

Referring to FIG. 1, an EM coupler 100 typically has a power input port 102, a power output port 104, a coupled port 106, and an isolation port 108. The electromagnetic coupling mechanism, which can include inductive or capacitive coupling, is typically provided by two parallel or overlapped transmission lines, such as microstrips, strip lines, coplanar lines, and the like. A main transmission line 110 extends between the power input port 102 and the power output port 104 and provides the majority of the signal 116 from the power input port 102 to the power output port 104. A coupled line 112 extends between the coupled port 106 and the isolation port 108 and may extract a portion 114 of the power traveling between the power input port 102 and the power output port 104 for various purposes, including various measurements. When a termination impedance is presented to the isolation port 108, an indication of forward RF power traveling from the power input port 102 to the power output port 104 is provided at the coupled port 106.

In a forward coupling mode, as in FIG. 1, the portion 114 is a fraction of the main signal 116 RF power traveling from the power input port 102 to the power output port 104. EM couplers are typically rated by their coupling factor, usually stated in decibels, which is a measure of the ratio of the power of the portion 114 coupled from the power of the input signal 116. For example, a 20 dB coupler will provide a coupled signal, e.g., a portion 114, that is 20 dB lower than the input power, or about 1% of the input power.

It is generally desirable to have a relatively low coupling factor to not overly remove power from the main signal, but it is also desirable for the coupling factor to be certain and consistent, to allow accurate assessments of the power of the main signal.

SUMMARY OF INVENTION

Aspects and embodiments are directed to electromagnetic couplers having structures designed to allow for tuning of coupler parameters and performance. As discussed in more detail below, a tuning element may be formed from various materials, e.g., conductors or semiconductors, in proximity to transmission lines that form a tunable electromagnetic coupler, which may be further combined with various components and features to form modules, devices, and systems. Tunable electromagnetic couplers may allow for selectively adjustable coupling factors and may also advantageously implement filtering effects, as discussed in more detail below.

According to one aspect, an electromagnetic coupler is provided. The coupler includes a first transmission line extending between an input port and an output port, a second transmission line disposed adjacent to the first transmission line and extending between a coupled port and an isolation port, a tuning element disposed adjacent at least one of the first transmission line and the second transmission line, and an adjustable impedance coupled between the tuning element and a reference node. The second transmission line is configured to provide a coupled signal at the coupled port responsive to receiving an input signal at the input port. The amplitude of the coupled signal is related to an amplitude of the input signal by a coupling factor, and the adjustable impedance is configured to adjust the coupling factor.

In some embodiments the reference node is ground. Some embodiments include a reactive component in the impedance, while others include only a resistive component. In certain embodiments the tuning element is configured to be selectively decoupled from the first transmission line and the second transmission line, e.g., by a switch.

The second transmission line may be laterally offset from the first transmission line. The second transmission line may be laterally offset from the tuning element. In some embodiments a portion of the second transmission line forms an overlapping region with at least one of the first transmission line and the tuning element.

According to another aspect, an electromagnetic coupler module is provided and includes a substrate with a dielectric layer having a first transmission line disposed thereon and extending between an input port and an output port, a second transmission line disposed adjacent to the first transmission line and extending between a coupled port and an isolation port, a tuning element disposed adjacent at least one of the first transmission line and the second transmission line, and an adjustable impedance coupled between the tuning element and a reference node. The second transmission line is configured to provide a coupled signal at the coupled port responsive to receiving an input signal at the input port. The amplitude of the coupled signal is related to an amplitude of the input signal by a coupling factor, and the adjustable impedance is configured to adjust the coupling factor. A protective outer surface may be included that overmolds at least a part of the substrate, the first and second transmission lines, and the tuning element.

In some embodiments the reference node is ground. Some embodiments include a reactive component in the adjustable impedance, while others include only a resistive component. In certain embodiments the tuning element is configured to be selectively decoupled from the first transmission line and the second transmission line, e.g., by a switch.

The second transmission line may be laterally offset from the first transmission line. The second transmission line may be laterally offset from the tuning element. In some embodiments a portion of the second transmission line forms an overlapping region with at least one of the first transmission line and the tuning element.

Some embodiments include an antenna switch connected to one of the input port and the output port. Some embodiments include a power amplifier coupled to one of the input port and the output port.

According to another aspect, an electronic device is provided and includes a first transmission line extending between an input port and an output port, a transceiver coupled to the input port and configured to produce a transmit signal, a second transmission line disposed adjacent to the first transmission line and extending between a coupled port and an isolation port, a tuning element disposed adjacent at least one of the first transmission line and the second transmission line, and an adjustable impedance coupled between the tuning element and a reference node. The second transmission line is configured to provide a coupled signal at the coupled port responsive to receiving an input signal at the input port. The input signal may be the transmit signal. The amplitude of the coupled signal is related to an amplitude of the input signal by a coupling factor, and the adjustable impedance is configured to adjust the coupling factor.

In some embodiments the reference node is ground. Some embodiments include a reactive component in the adjustable impedance, while others include only a resistive component. In certain embodiments the tuning element is configured to be selectively decoupled from the first transmission line and the second transmission line, e.g., by a switch.

The second transmission line may be laterally offset from the first transmission line. The second transmission line may be laterally offset from the tuning element. In some embodiments a portion of the second transmission line forms an overlapping region with at least one of the first transmission line and the tuning element.

Some embodiments include an antenna switch module connected to either the input port or the output port and configured to direct the transmit signal to at least one of the transceiver and an antenna. Some embodiments include a power amplifier connected between the transceiver and the input port, the power amplifier being configured to receive and amplify the transmit signal.

Certain embodiments include an antenna coupled to the output port, the antenna being configured to transmit the transmit signal and to receive a receive signal. The output port may be further configured to receive the receive signal from the antenna and to provide the receive signal at the input port.

Certain embodiments include a sensor coupled to the coupled port and configured to detect a power level of the coupled signal. Some embodiments include a baseband sub-system coupled to the transceiver and configured to provide a baseband signal to the transceiver. In some embodiments, any of a sensor module, a memory, a baseband sub-system, a user interface, and/or a battery may be included.

In yet another aspect an electromagnetic coupler is provided that includes a first transmission line extending between an input port and an output port configured to provide an output signal at the output port responsive to receiving an input signal at the input port, a second transmission line disposed adjacent to the first transmission line and extending between a coupled port and an isolation port, a tuning element disposed adjacent at least one of the first transmission line and the second transmission line, and an impedance including a reactive component coupled between the tuning element and a reference node. The second transmission line is configured to provide a coupled signal at the coupled port responsive to receiving the input signal at the input port. The impedance and tuning element are configured to filter a range of frequency components of the output signal.

In some embodiments the reference node is ground. Some embodiments include a resistive component in the impedance. The impedance may be adjustable. In certain embodiments the tuning element is configured to be selectively decoupled from the first transmission line and the second transmission line, e.g., by a switch.

The second transmission line may be laterally offset from the first transmission line. The second transmission line may be laterally offset from the tuning element. In some embodiments a portion of the second transmission line forms an overlapping region with at least one of the first transmission line and the tuning element.

According to another aspect an electromagnetic coupler module is provided and includes a substrate with a dielectric layer having a first transmission line disposed thereon extending between an input port and an output port, a second transmission line disposed adjacent to the first transmission line and extending between a coupled port and an isolation port, a tuning element disposed adjacent at least one of the first transmission line and the second transmission line, and an impedance including a reactive component coupled between the tuning element and a reference node. The second transmission line is configured to provide a coupled signal at the coupled port responsive to receiving the input signal at the input port. The impedance and tuning element are configured to filter a range of frequency components of the output signal.

In some embodiments the reference node is ground. Some embodiments include a resistive component in the impedance. The impedance may be adjustable. In certain embodiments the tuning element is configured to be selectively decoupled from the first transmission line and the second transmission line, e.g., by a switch.

The second transmission line may be laterally offset from the first transmission line. The second transmission line may be laterally offset from the tuning element. In some embodiments a portion of the second transmission line forms an overlapping region with at least one of the first transmission line and the tuning element.

Some embodiments include an antenna switch connected to one of the input port and the output port. Some embodiments include a power amplifier coupled to one of the input port and the output port.

According to another aspect, an electronic device is provided. The electronic device includes a first transmission line extending between an input port and an output port, a transceiver coupled to the input port and configured to produce a transmit signal, a second transmission line disposed adjacent to the first transmission line and extending between a coupled port and an isolation port, a tuning element disposed adjacent at least one of the first transmission line and the second transmission line, and an impedance including a reactive component coupled between the tuning element and a reference node. The second transmission line is configured to provide a coupled signal at the coupled port responsive to receiving the input signal at the input port. The impedance and tuning element are configured to filter a range of frequency components of the output signal.

In some embodiments the reference node is ground. Some embodiments include a resistive component in the impedance. The impedance may be adjustable. In certain embodiments the tuning element is configured to be selectively decoupled from the first transmission line and the second transmission line, e.g., by a switch.

The second transmission line may be laterally offset from the first transmission line. The second transmission line may be laterally offset from the tuning element. In some embodiments a portion of the second transmission line forms an overlapping region with at least one of the first transmission line and the tuning element.

Certain embodiments include an antenna switch module connected to either the input port or the output port and configured to direct the transmit signal to at least one of the transceiver and an antenna. Some embodiments include a power amplifier connected between the transceiver and the input port, the power amplifier being configured to receive and amplify the transmit signal.

Some embodiments include an antenna coupled to the output port, the antenna being configured to transmit the transmit signal and to receive a receive signal. The output port may be configured to receive the receive signal from the antenna and to provide the receive signal at the input port.

Certain embodiments include a sensor coupled to the coupled port and configured to detect a power level of the coupled signal. Some embodiments include a baseband sub-system coupled to the transceiver and configured to provide a baseband signal to the transceiver. In some embodiments, any of a sensor module, a memory, a baseband sub-system, a user interface, and/or a battery may be included.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3D is a top view schematic diagram of an alternative example of a tunable coupler;

FIG. 3E is a top view schematic diagram of an alternative example of a tunable coupler;

DETAILED DESCRIPTION

Figure 1:
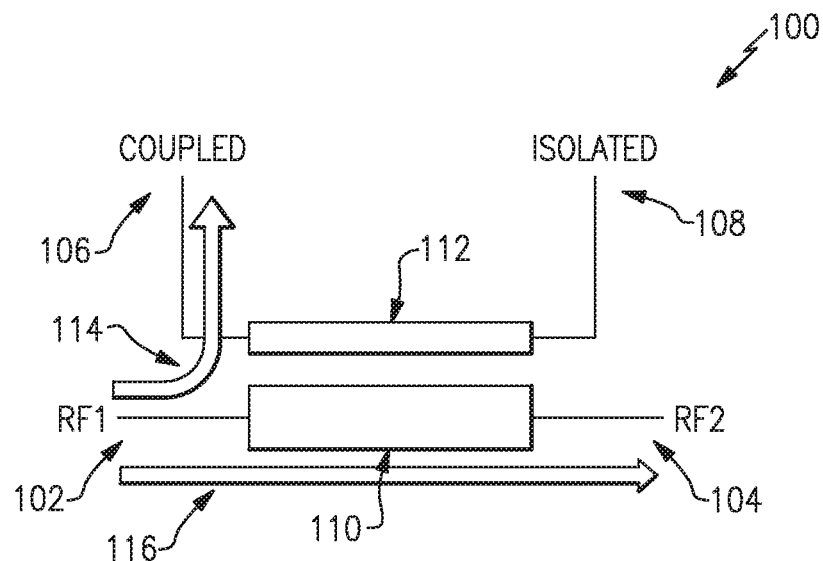
FIG. 1 is a diagram of one example of an electromagnetic coupler.

Traditional multi-layer coupler designs, either implemented in laminate manufacturing processes or semiconductor manufacturing processes, are conventionally designed to have a particular coupling factor at a particular frequency or frequency band. Tunable couplers, modules, and devices in accord with aspects disclosed herein allow for an adjustable coupling factor by including a tuning element and an adjustable grounding impedance associated with the tuning element. Adjustability of the coupling factor may beneficially allow for adapting the coupler to multiple frequency bands and/or multiple applications, each of which may allow fewer stock parts to support a range of products, and allow adjustability to correct for manufacturing variation which in turn increases production yield, all of which reduces cost. For example, a grounded tuning element in accord with various aspects and examples disclosed herein provides compensation for variations in coupling factor caused by variations in dielectric thickness between metal layers forming a main transmission line and a coupled line. An adjustable impedance coupled to the tuning element, i.e., a selectable impedance placed in series in the connection to ground, allows adjustment of this compensating effect and shifts the coupling factor, thus allowing multiple selectable coupling factors and filtering effects based on the selected impedance. The tuning element with a selective impedance coupling to ground forms a variable electromagnetic shunt that affects the capacitive and inductive coupling between the main transmission line 110 (see, e.g., FIG. 1) and the coupled line 112.

Figure 2:
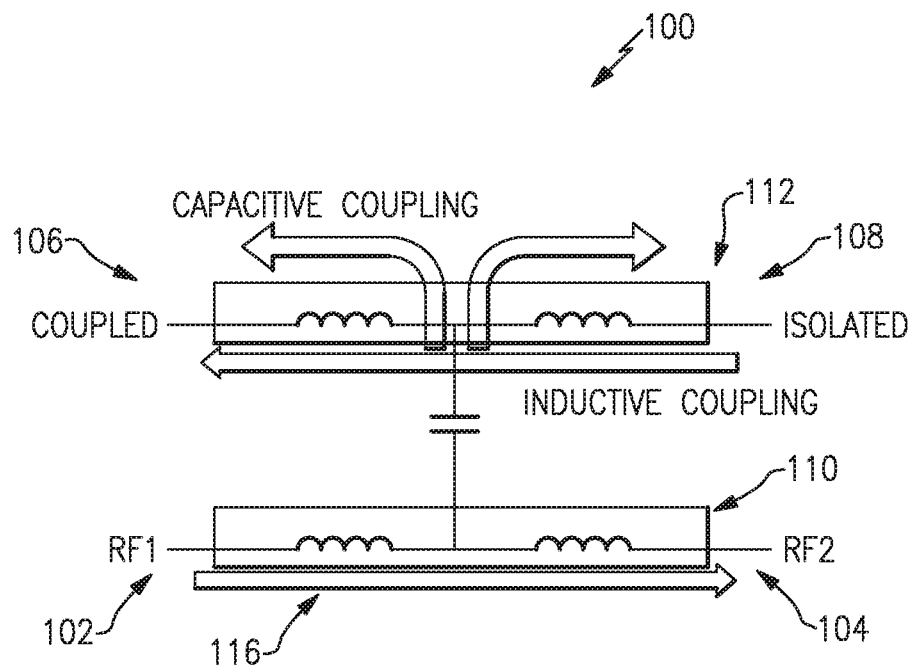
FIG. 2 is an illustration of a theory of coupling.

Capacitive and inductive coupling is briefly described with reference to FIG. 2, which shows the power input port 102, the power output port 104, the coupled port 106, and the isolation port 108. The main transmission line 110 and the coupled line 112 may be considered to be inductors, and there is an inductive coupling between them due to their proximity to one another. Additionally, the proximity of the coupled line 112 to the main transmission line 110 forms a capacitor, such that there is also a capacitive coupling between the two lines. Both forms of coupling, inductive and capacitive, vary with proximity between the main transmission line 110 and the coupled line 112, along with other factors such as geometry and material selections. Accordingly, the coupling factor of an EM coupler will vary if the proximity between the main transmission line and the coupled line changes. Modern transmission line couplers may be manufactured using laminate and/or semiconductor techniques, and the transmission lines may be separated from each other by a layer of dielectric material. The coupling factor and other characteristics of an EM coupler may also be varied by other elements, such as a tuning element as disclosed herein, that influence the inductive and capacitive coupling between the main transmission line and the coupled line.

Aspects and embodiments provide a coupler that includes additional elements to influence the inductive and capacitive coupling for the advantage of adjusting the coupling factor and providing frequency dependent filter effects. The coupling factor variation may be further influenced by variation in spacing between the main transmission line and coupled line, such as by variation in dielectric thickness between the lines, spacing between the metal traces forming the lines, or variation in the line widths and heights, all brought about by design differences and by variations during the manufacturing processes. Achieving a specific coupling factor is desirable because the coupled signal may be used to determine the power of the main signal, and thus the ratio of the coupled signal to the main signal, i.e., the coupling factor, may be a key factor to meet challenging performance specifications. In mobile phone applications, the ability to accurately monitor and control signal power can be critical. As devices and components get ever smaller in size and are required to support more or broader frequency bands, adjustability of coupling factor and compensation for variations brought in by the manufacturing process (referred to herein as process variations) may become ever more significant. Embodiments of the EM couplers disclosed herein include additional components acting as tuning stubs to counteract coupling factor variation and to allow adjustability of coupling factor and filter effects.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, side, end, vertical and horizontal, and the like, are intended for convenience of description, not to limit the present systems and methods or their components to any one positional or spatial orientation.

According to certain embodiments, in an EM coupler, a coupled line may be positioned in various orientations relative to a main transmission line. One or more additional traces or transmission lines may be positioned to affect the coupling between the main transmission line and the coupled line in a manner that will tend to influence the coupling factor, yielding manufactured EM couplers having lower variation in coupling factor than conventional designs and allowing for adjustability of the coupling factor and implementation of filter effects.

Figure 3A:
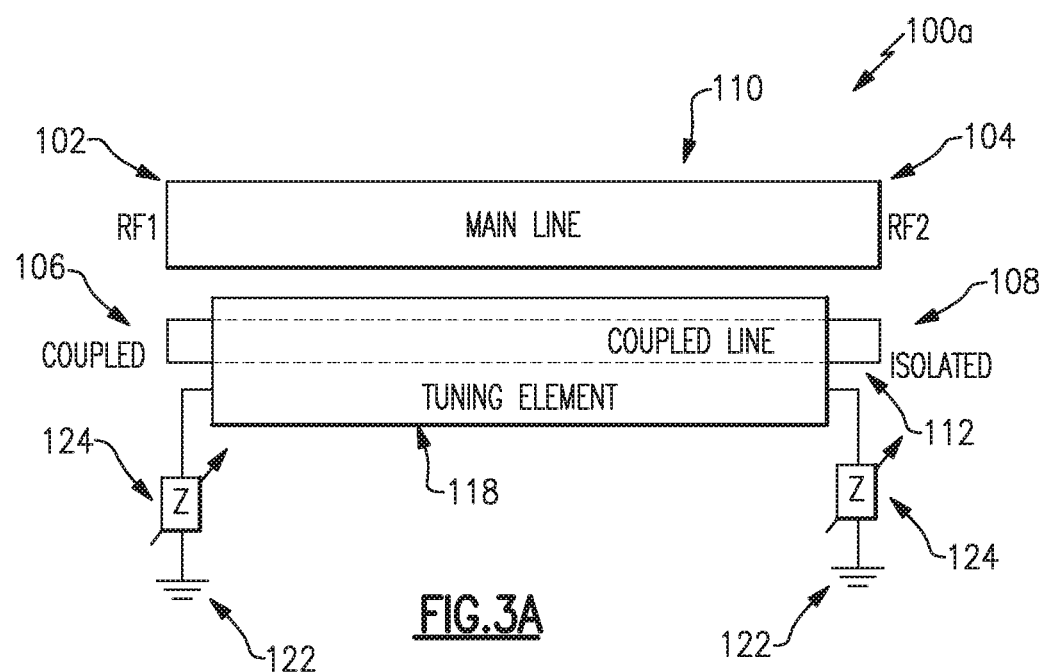
FIG. 3A is a top view schematic diagram of an example of a tunable coupler.
Figure 3B:
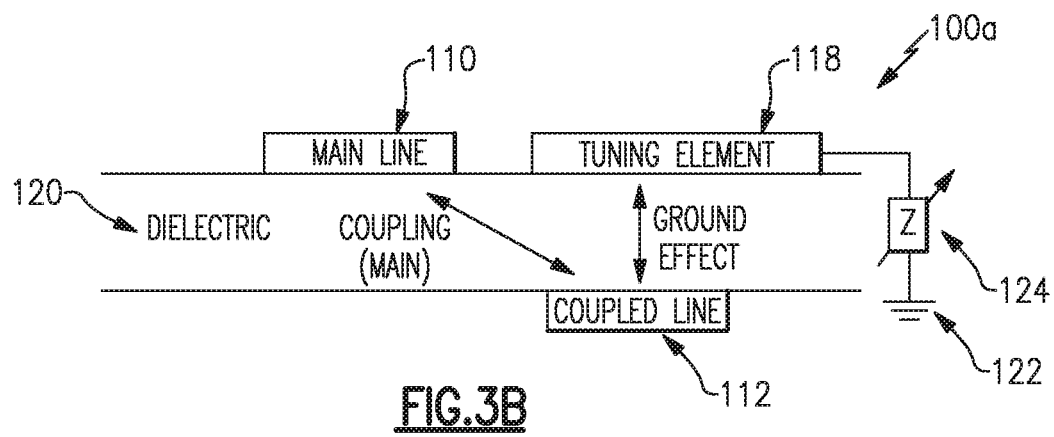
FIG. 3B is an end view schematic diagram of the tunable coupler of FIG. 3A.

Various examples of such arrangements are shown in FIGS. 3A-3E. FIG. 3A is a top schematic view of an example of an EM coupler, showing the main transmission line 110, the coupled line 112, and a tuning element 118 coupled to ground 122 through one or more impedances 124. FIG. 3B is a corresponding end view of the transmission lines shown in FIG. 3A. In this example, the tuning element 118 is in the same plane with the main transmission line 110, and the coupled line 112 is located in a different plane below (or above) the tuning element 118, separated by a dielectric material 120 and offset from the main transmission line 110. In an alternative example, shown in FIG. 3C, the tuning element 118 may be in the same plane with the coupled line 112, and the main transmission line 110 may be located in a different plane below (or above) the tuning element 118, separated by the dielectric material 120 and offset from the coupled line 112.

The transmission lines 110, 112, tuning element 118, and the dielectric material 120 may be manufactured by a laminating process or a deposition and etching process, for example. As may be seen in FIGS. 3B and 3C, thickness of the dielectric material 120 can determine the spacing, or distance, between the first plane and the second plane, and therefore between the tuning element 118 and either the coupled line 112 or the main transmission line 110. This spacing, the presence of the tuning element 118, the value of the impedances 124, and other factors all affect the capacitive and inductive coupling among the lines.

Figure 3C:
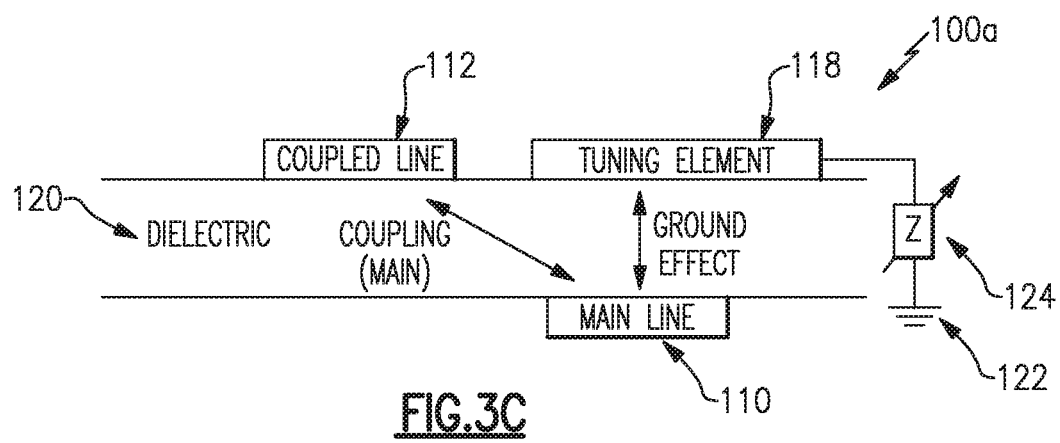
FIG. 3C is an end view schematic diagram of an alternative example of a tunable coupler.

The tuning element 118 in the examples of FIGS. 3A-3C include a grounding 122 through an impedance 124 at each end, forming a partial ground plane and creating an electromagnetic shunt effect with the coupled line 112 and/or the main transmission line 110. The impedance 124 at each grounding 122 allows selective and adjustable coupling of the tuning element 118 to ground. In certain embodiments the tuning element 118 may include one or more impedances 124 through which the tuning element 118 is coupled to a ground 122 connection. Each impedance 124 may be an adjustable impedance and may be controlled by various embodiments of elements having variable impedance parameters, e.g., resistance, inductance, capacitance. In certain embodiments an impedance 124 may be adjustable from zero ohms (i.e., a direct connection to ground 122) to infinite impedance (i.e., an open circuit with no connection to ground 122), and may include or accommodate any suitable impedance in between, real or complex, i.e., including any of a resistance value and a reactance value. In some examples, an adjustable impedance 124 may include a number of switched elements interconnected in a manner to be selectively included or excluded in the impedance 124. Such an example is discussed in more detail below with reference to FIG. 8. Selective switching of elements may be implemented using transistors as switching elements, such as field effect transistors or bipolar junction transistors, for example, through various fabrication techniques. Alternate embodiments may also include switches to selectively connect the tuning element 118 to alternate nodes, reference voltages, or otherwise, instead of ground 122.

In various embodiments the tuning element 118 may be adjustably coupled to ground 122 through the one or more impedances 124, including being directly electrically connected to ground 122 or disconnected from ground 122, thereby removing the effect of the tuning element 118 in cases when it may not be needed. Additionally, the impedances 124 and the groundings 122 may be located at differing positions in various embodiments. For example, while the impedances 124 in FIGS. 3A-3C are shown connected near the ends of the tuning element 118, alternate embodiments may include impedances 124 at additional or alternate positions, such as along the length of the tuning element 118, and may be coupled to the tuning element 118 at its sides, middle, or elsewhere.

In the example embodiment of FIG. 3B, the coupled line 112 is substantially below the tuning element 118 and offset from the main transmission line 110. In other embodiments, the coupled line 112 may be substantially below the main transmission line 110 and offset from the tuning element 118, or the coupled line 112 may be offset from each of the main transmission line 110 and the tuning element 118, or the transmission lines may be otherwise oriented to each other in any number of ways, such as adjacent each other on the same plane, or otherwise. Additionally, it will be understood that the main transmission line 110, the coupled line 112, and the tuning element 118 may have various shapes and may be constructed of various materials. The main transmission line 110 and the coupled line 112 may be formed of a conductor, such as a metal, and the tuning element 118 may also be formed of a conductor, but may alternately be formed of a semiconductor or other material selected based upon its influence on coupling factor.

As discussed above, any of the main transmission line 110, the coupled line 112, and the tuning element 118 may have various shapes and, in particular, need not be straight lines nor be limited to a particular plane. Additionally, numerous variations may be made to influence coupling factor or other effects and to tailor the tuning effect of the tuning element 118, including but not limited to, material, geometry (width, length, shape, etc.), position, and the like of any of the main transmission line 110, the coupled line 112, and the tuning element 118.

Any physical arrangement of main transmission line 110, coupled line 112, and tuning element 118 suitable to perform or function in a tuning manner as described herein may be included in various embodiments. For example, FIGS. 3D and 3E illustrate alternative physical arrangements of the main transmission line 110, the coupled line 112, and the tuning element 118. FIGS. 3D and 3E each illustrate a main transmission line 110 implemented as a loop, with a coupled line 112 implemented as a loop adjacent to the main transmission line 110 and, in this example, in a different plane from the main transmission line 110, e.g., on a different layer with a dielectric in between. The example of FIG. 3D includes a tuning element 118 in the form of a loop in the same plane as the main transmission line 110 with ends selectively switched 124 to a grounding 122. The example of FIG. 3E includes a tuning element 118 having a larger continuous form factor, rather than a bent strip, as compared to FIG. 3D. The tuning element 118 of the example of FIG. 3E also includes an adjustable impedance 124 coupling to ground 122. Alternate embodiments include numerous variations in physical structure, materials, and arrangement of the main transmission line 110, coupled line 112, and tuning element 118.

Figure 4:
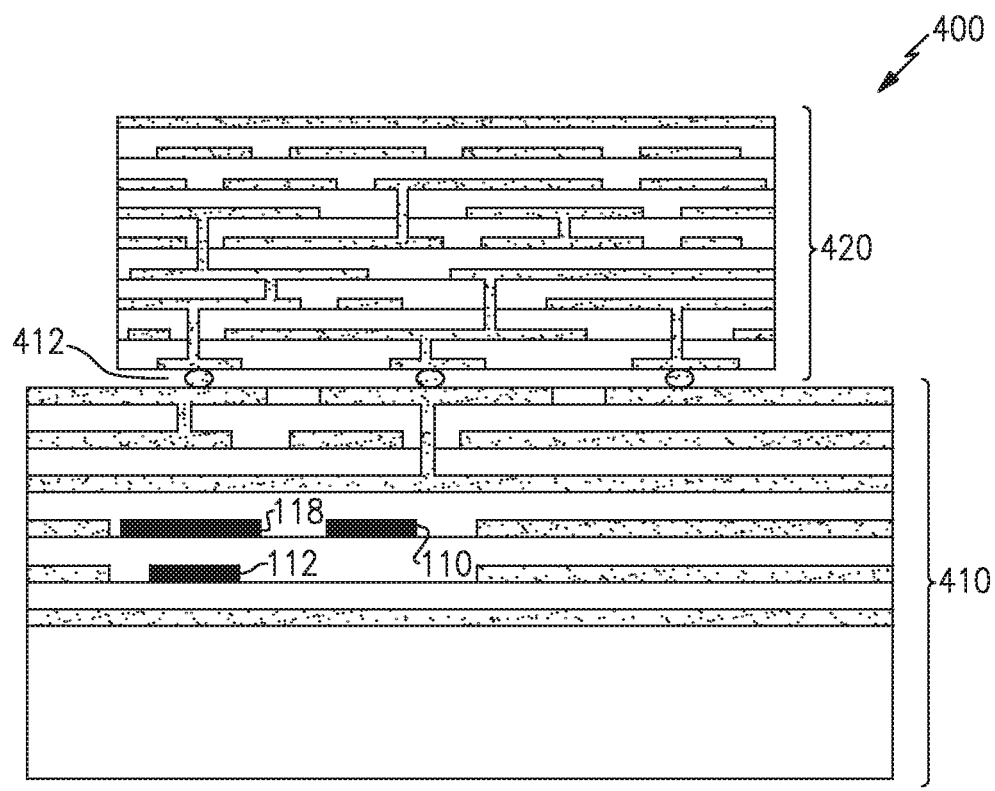
FIG. 4 is a side view schematic diagram of a layout of an example tunable coupler.

While FIGS. 3A-3E illustrate various physical shapes and arrangements of the main transmission line 110, coupled line 112, and tuning element 118 relative to each other, FIG. 4 illustrates an example of locations for these elements within a stackup 400. FIG. 4 illustrates some aspects of an example construction of any of the EM couplers described herein. The example of FIG. 4 includes a circuit stackup 400 that includes a laminate substrate 410 and a die 420 mounted on and electrically connected to the laminate substrate 410 via solder bumps 412. The substrate 410 and the die 420 are each made up of multiple layers of conducting (e.g., metal) or semiconducting materials separated by dielectric, with interconnections between layers through conductive vias. In various embodiments, the die 420 may be electrically connected to the substrate 410 by other arrangements, such as pins, sockets, pads, balls, lands, etc. Other embodiments may include only a laminate substrate 410 and no die 420.

In the example of FIG. 4, the main and coupled line sections of the EM coupler are implemented within the layers of the substrate 410. FIG. 4 shows an "end view" of the main transmission line 110 and the coupled line 112 in that the extent of their length may be perpendicular to the plane of the image. As shown, the coupled line 112 is formed on a layer below and offset from the main transmission line 110, and below and in proximity to the tuning element 118, similar to the arrangement of FIG. 3B. In embodiments and as shown in FIG. 4, the tuning element 118 may be in the same layer as, and adjacent to, the main transmission line 110. As discussed above, the main transmission line 110 and the coupled line 112 may be exchanged in the figure, or other physical arrangements of the elements relative to each other may be suitable. Also as discussed above, in certain embodiments, any of the main transmission line 110, coupled line 112, or tuning element 118 may include curved or angled sections and may not be straight. Additionally, the main transmission line 110, coupled line 112, and tuning element 118 may be implemented in one or more layers of either the substrate 410 or the die 420. Additionally, while the stackup 400 has been described as a substrate 410 and a die 420, the stackup 400 could equivalently be described as a circuit board (e.g., 410) and a substrate (e.g., 420), or a stackup may have multiple and/or additional layered structures. For example, a multi-chip module may have a substrate and multiple dies, and a device may include a circuit board having one or more multi-chip modules mounted thereto. The main transmission line 110, coupled line 112, and tuning element 118 of any of the EM couplers described herein may be implemented among or across multiple layers of various structures.

Additionally, switches, groundings, filters, impedances (such as impedances 124), control circuitry, communication interfaces, and memory, as well as other components, may also be implemented within a stackup, such as the stackup 400, at one or more layers of a circuit board, a substrate, or a die, or may be distributed among the various layers or may be external to a stackup, or any combination of these.

As discussed above, the effect of the tuning element 118 coupled to ground 122 through an impedance 124 is to shunt some coupled power away from the other elements, i.e., the main transmission line 110 and the coupled line 112. A resistive component of the impedance 124 causes the tuning element 118 to shunt more or less power away, thereby affecting coupling factor. Further including a reactive component in the impedance 124 may cause the tuning element 118 to shunt more or less power away based upon frequency, thereby creating filter effects. Certain examples may include only a resistive component, i.e., an impedance having only a real value, and no reactive components, i.e., an impedance without any complex or imaginary value. Such a resistive-only impedance may be implemented to allow adjustment of coupling factor without producing frequency-dependent effects.

Figure 5:
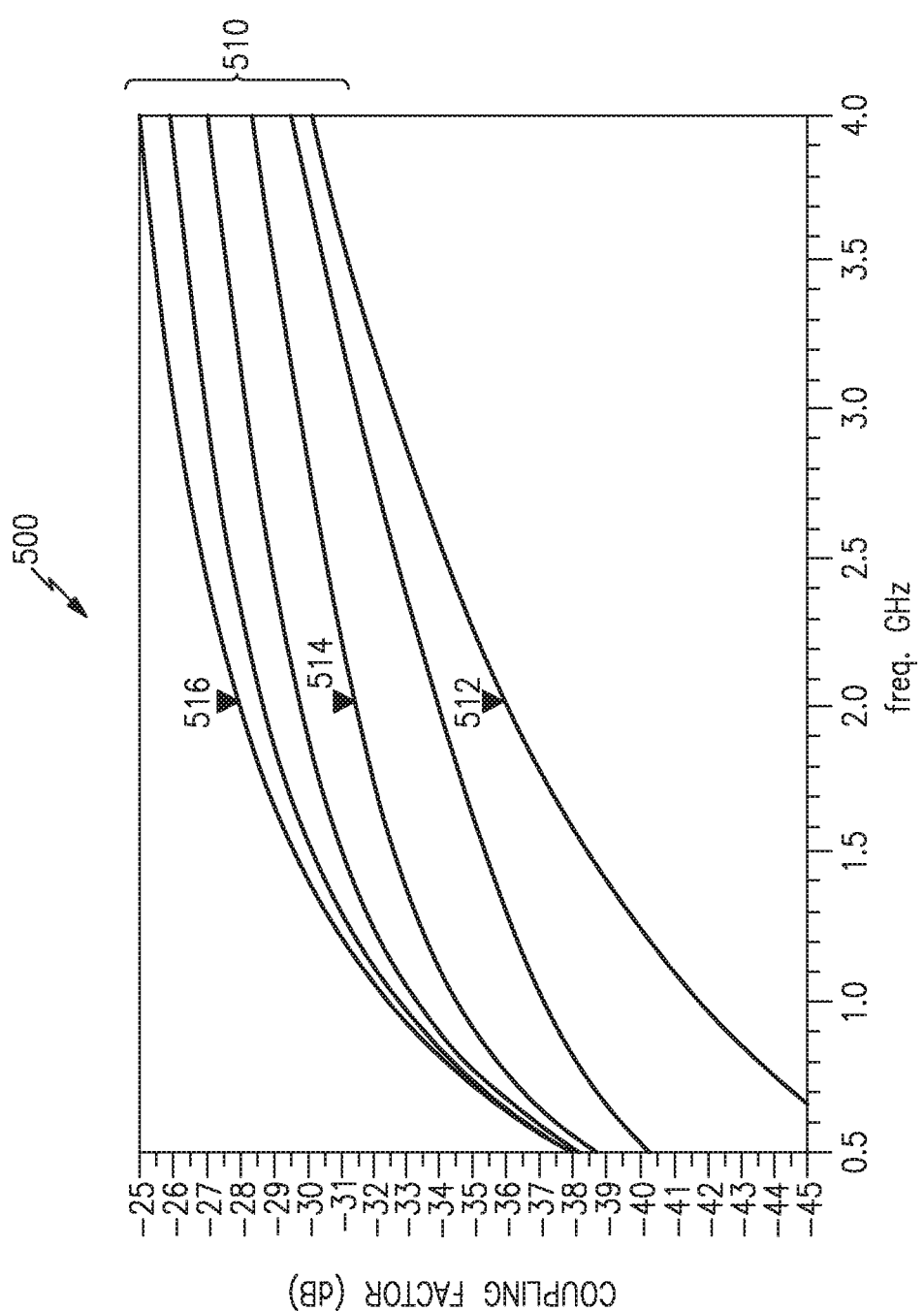
FIG. 5 is a graph of coupling factor versus frequency for a range of resistances applied to a tuning element.

Accordingly, electromagnetic couplers having a tuning element 118 in accord with aspects and embodiments disclosed herein allow for tunable adjustment of coupling factor and for frequency-dependent filtering to accommodate varying needs and applications, and/or to compensate for variations in manufacturing process. The adjustable effect of the tuning element 118 is discussed with reference to performance graphs illustrated in FIGS. 5 through 7. FIG. 5 shows multiple curves of coupling factor on the Y-axis across a range of frequencies on the X-axis. Each curve represents a different resistive value between 0 and 5 Ohms for the impedances 124 for a tunable coupler similar to that shown in, e.g., FIGS. 3A-3B. Curve 512 shows the coupling factor versus frequency for an impedance 124 of zero Ohms, i.e., a direct connection to ground 122. Curve 514 shows the coupling factor versus frequency for an impedance 124 of 2 Ohms, while curve 516 shows coupling factor for an impedance 124 of 5 Ohms. Intermediate curves show coupling factor for intermediate integer resistive values of impedance 124. The coupling factor values at a frequency of 2.00 GHz across resistive impedance 124 values of 0 to 5 Ohms are tabulated in Table 1, in decibels.

TABLE 1

| Impedance (Ohms) | Coupling Factor at 2.00 GHz |
|---|---|
| 0.00 | 35.93 dB |
| 1.00 | 33.89 dB |
| 2.00 | 31.40 dB |
| 3.00 | 29.70 dB |
| 4.00 | 28.62 dB |
| 5.00 | 27.91 dB |

As may be seen with reference to Table 1, coupling factor may be adjusted within an 8 dB range spanning from about 28 dB to 36 dB in this example, by altering a resistive impedance 124 applied to couple the tuning element 118 to ground 122. Accordingly, varying the resistive coupling to ground of a tuning element 118 may be advantageously implemented to vary the coupling factor of an electromagnetic coupler. Frequency effects, such as frequency notch filtering, may also be advantageously applied (and varied) by including (and varying) a reactive component in the ground coupling, e.g., impedance 124, of the tuning element 118, as discussed further below.

Figure 6:
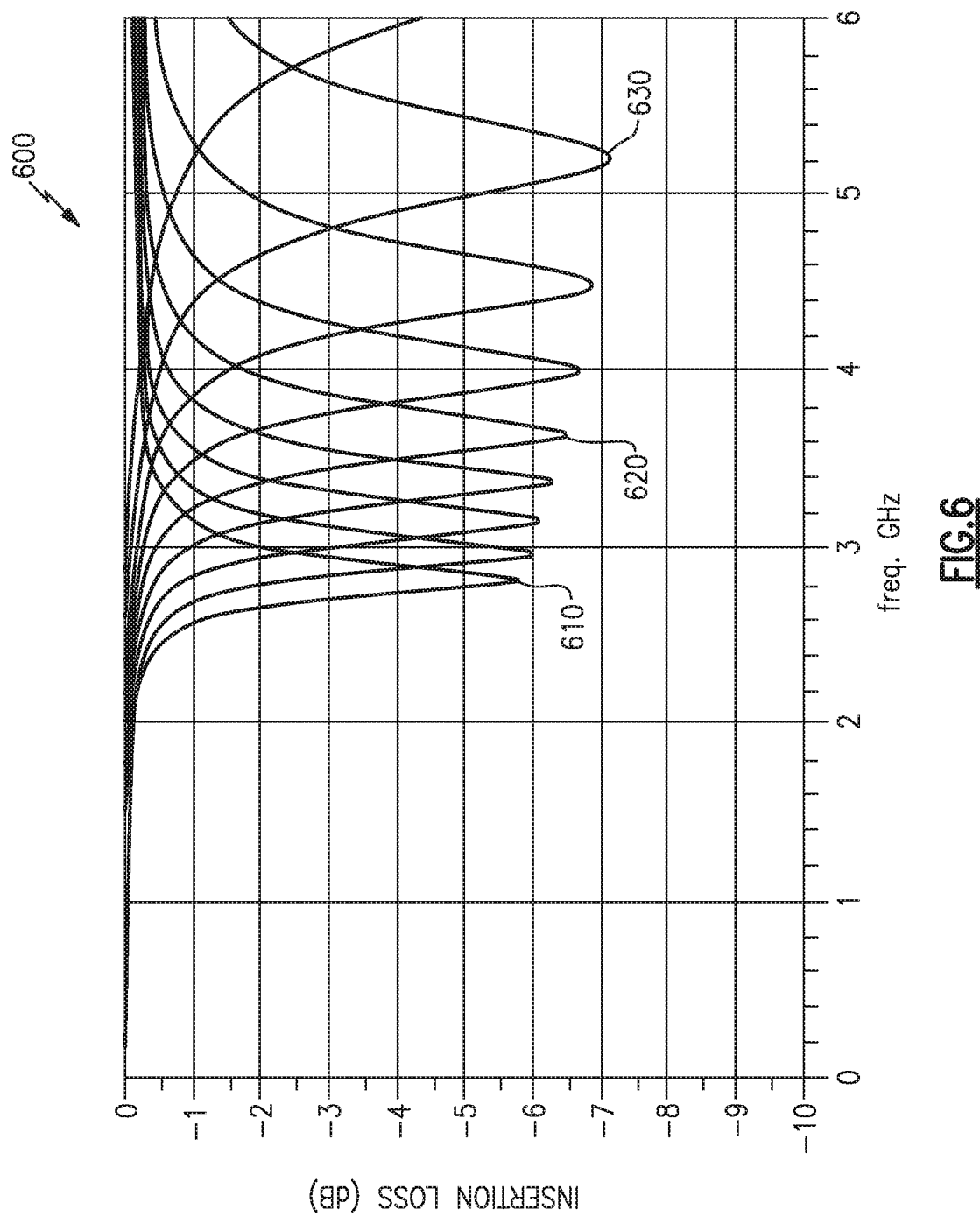
FIG. 6 is a graph of insertion loss versus frequency for a range of capacitances applied to a tuning element.
Figure 7:
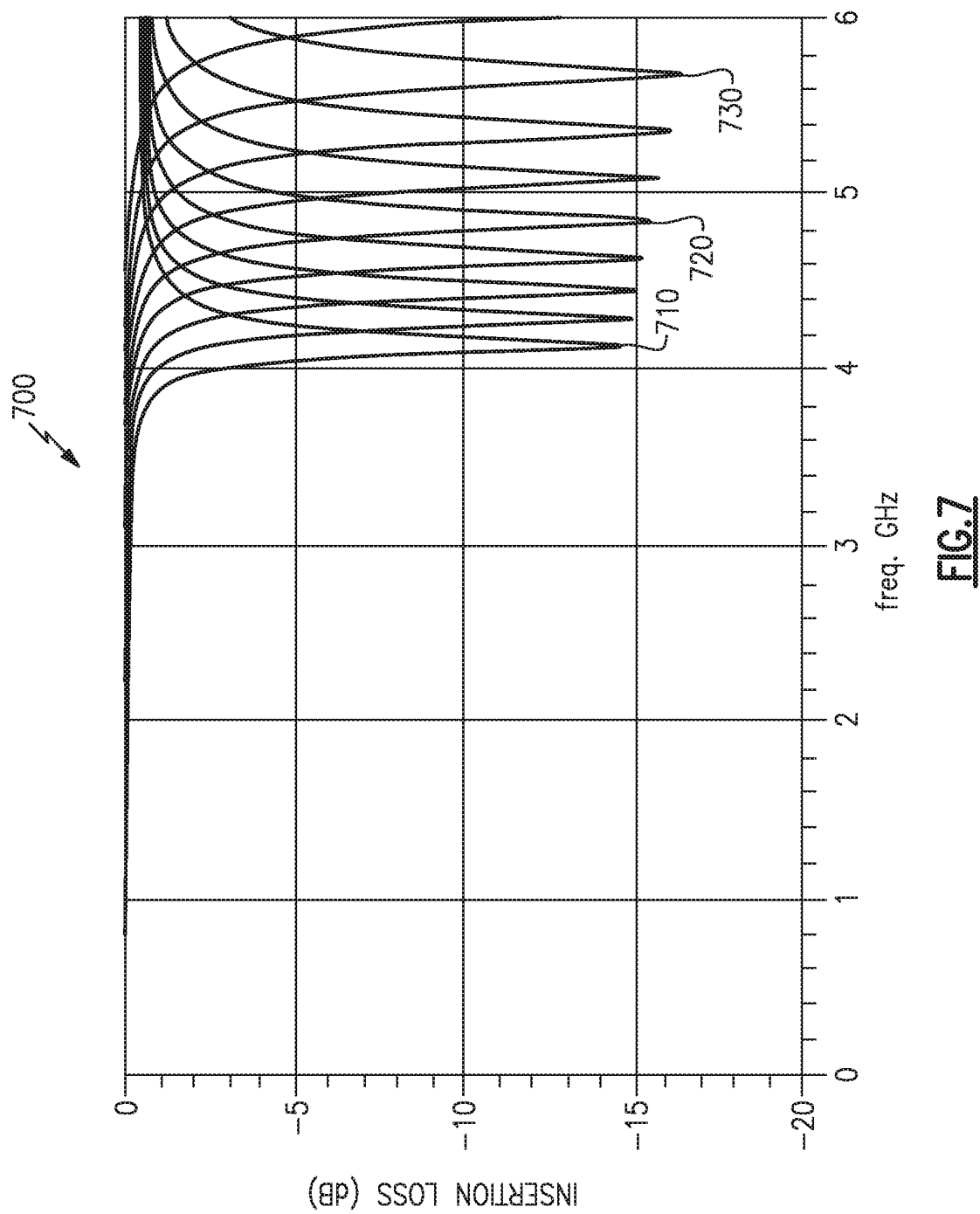
FIG. 7 is a graph of insertion loss versus frequency for a range of inductances applied to a tuning element.

Frequency filtering of aspects and embodiments can be described with reference to insertion loss. Insertion loss is a comparison of signal power at the output of the coupler relative to the signal power at the input. The majority of input signal power is typically transferred to the output port, with a relatively small amount of signal power coupled to the coupled port, and thus insertion loss is typically close to zero decibels in the operating frequency range of the coupler. Each of FIGS. 6 and 7 shows multiple curves of insertion loss across a range of frequencies for a tunable coupler similar to that shown in FIGS. 3A-3B. Each curve represents a different capacitive impedance 124 in the case of FIG. 6 and a different inductive impedance 124 in the case of FIG. 7. A reduced signal output, as shown in FIGS. 6 and 7 at higher frequencies, represents signal power that is rejected by the coupler, e.g., signal power that is not transferred through to the output port. The tuning element 118 shunts a portion of the power through the impedance 124 to ground 122, which contributes to signal power being rejected, e.g., not transferred to the output port. This effect is advantageously used to reject, e.g., filter out, unwanted signal power in, e.g., a specific frequency range.

With reference to FIG. 6, the curve 610 shows insertion loss versus frequency for an impedance 124 having 10 pico-Farads (pF) capacitance. Curve 620 shows insertion loss for an impedance 124 having 6 pF capacitance, and curve 630 for an impedance 124 with 3 pF capacitance. Intermediate curves in FIG. 6 represent intermediate integer capacitance values. As can be seen with reference to FIG. 6, this example provides a coupler that may be adjusted to produce a peak reduction of about 6 dB in signal power at an adjustable frequency from about 2.8 GHz (at the peak of curve 610) to more than 6 GHz (at curve peaks off the scale to the right of FIG. 6).

With reference to FIG. 7, the curve 710 shows insertion loss versus frequency for an impedance 124 having 15 nano-Henries (nH) inductance. Curve 720 shows insertion loss for an impedance 124 having 11 nH inductance, and curve 730 for an impedance 124 with 8 nH inductance. Intermediate curves in FIG. 7 represent intermediate integer inductance values. As can be seen with reference to FIG. 7, this example provides a coupler that may be adjusted to produce a peak reduction of about 15 dB in signal power at an adjustable frequency from about 4.1 GHz (at the peak of curve 710) to more than 6 GHz (at curve peaks off the scale to the right of FIG. 7).

The graphs of FIGS. 6 and 7 illustrate that for various reactive impedances 124 there is a frequency at which an input signal will be significantly reduced at the output, by action of the tuning element 118 and the impedance 124 coupling to ground 122. The curves in FIGS. 6 and 7 illustrate operation of the coupler as a notch filter that rejects a narrow band or "notch" of frequencies. In the examples shown in FIGS. 6 and 7 there is an effective upper limit of frequency passed by the coupler. Higher frequencies are rejected by the coupler, i.e., reduced transfer from the input to the output, which may be useful to filter out sidetones and harmonics above an intended frequency band of operation. Accordingly, an adjustable frequency rejection, or filtering, may be implemented by variably adjusting a reactance of the impedance 124. In certain examples, tunable couplers may include various combinations of resistances, impedances, and capacitances to provide various fixed or adjustable impedances 124 that couple a tuning element 118 to ground 122 to advantageously tune the coupling factor and/or frequency-dependent filtering effects, or to advantageously allow adjustability of the coupling factor and/or frequency-dependent filtering effects.

Figure 8:
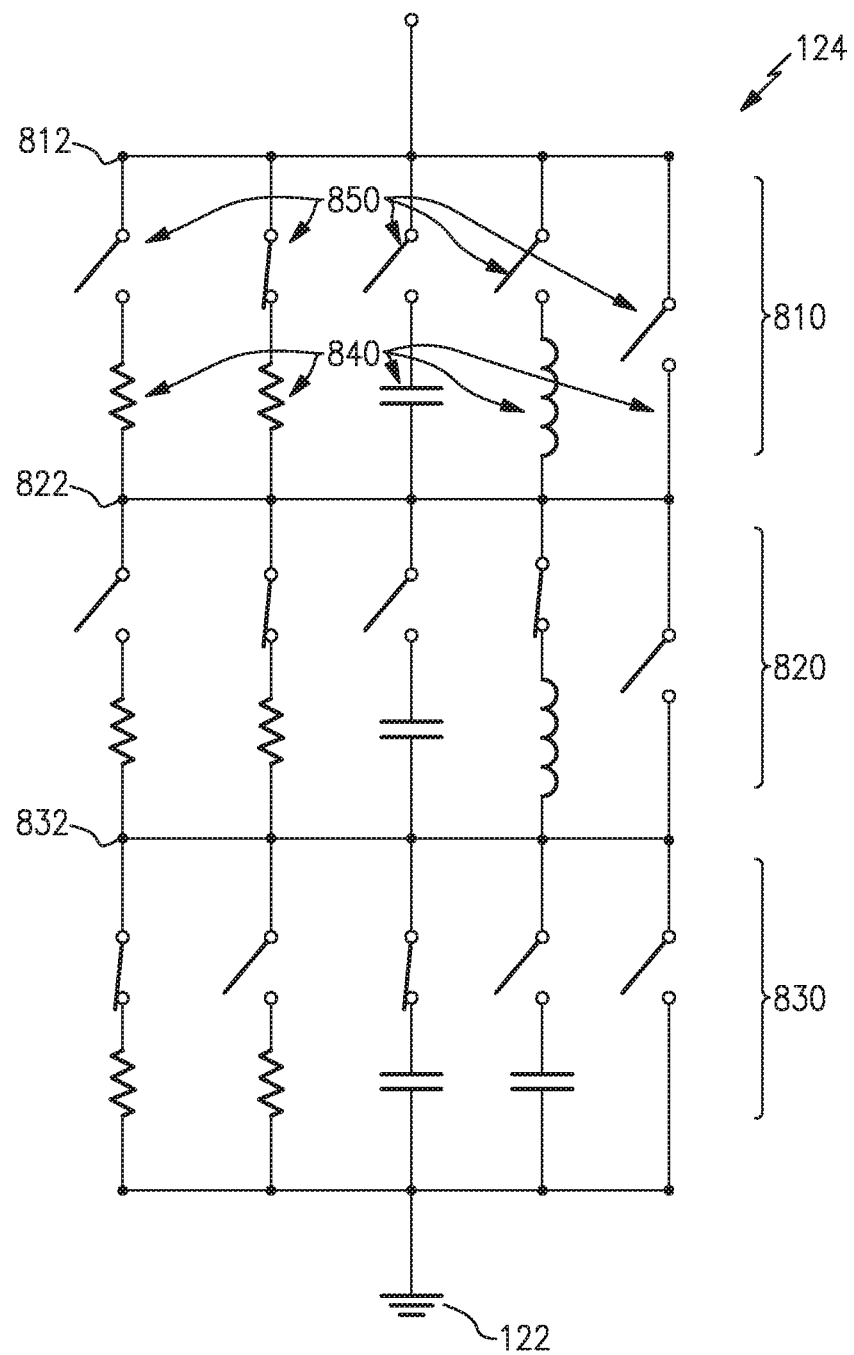
FIG. 8 is a schematic diagram of one example of an adjustable impedance.

One example of an adjustable impedance 124 is shown in FIG. 8. The impedance 124 circuit shown in FIG. 8 includes multiple banks 810, 820, 830 of impedance elements 840 that may be selectively switched 850 into the circuit of impedance 124. As shown, each bank 810, 820, 830 includes one or more impedances 840 in parallel, and the banks 810, 820, 830 are arranged in series with common nodes 812, 822, 832 between the banks 810, 820, 830. In the example shown, at least one of the impedances 840 in each bank 810, 820, 830 has zero impedance so that each bank 810, 820, 830 may be selectively bypassed. Further, if all the banks 810, 820, 830 are bypassed, the impedance 124 has overall zero impedance and couples directly to ground 122, i.e., provides a zero ohm connection between a tuning element 118 and ground 122. Additionally, if all the switches 850 are open-circuited, the impedance 124 provides an open circuit, i.e., disconnects the tuning element 118 from ground 122. Each of the switches 850 may be formed of one or more transistors, such as field effect transistors, bipolar junction transistors, or other suitable transistor types; or may be formed of micro-electromechanical systems (MEMS) or the like; or any other suitable switching element that enables selective connectivity of the impedance elements 840 between the nodes 812, 822, 832.

The switches 850 may be controlled by a control logic providing a signal voltage to, e.g., one or more transistor gates, transistor bases, and the like. Controllers may include memory and store switch settings, e.g., on or off, conducting versus non-conducting, to control the switches 850 to establish a particular impedance value presented by the impedance 124. A controller may be part of a device and may adjust the impedance 124 to adjust the coupling factor, filter effects, or both, in response to operating parameters of the device, such as frequency band of operation, or feedback from other devices or components, command and control signals from other devices or components, or user-established settings, for example.

The adjustable impedance 124 shown in FIG. 8 is merely one example of an adjustable impedance and any adjustable impedance may be suitable for adjusting the coupling factor and/or filter effects of couplers in accord with aspects and embodiments disclosed herein. Additionally, certain embodiments may include a fixed impedance 124 to establish a fixed coupling factor and/or filter effect. Additionally, a coupler design may include one or more impedances 124 provided during one portion of a fabrication process that are selectively wired during another portion of fabrication to produce multiple part numbers having differing coupling factors and/or filter effects. Alternately, multiple impedances 124 may be provided during one portion of fabrication that are selectively connected or selectively disconnected during another portion of fabrication based upon the results of performance tests or manufacturing variation tests to provide a mass manufacture of parts having a higher yield than would otherwise be the case.

As discussed above, the main transmission line 110, coupled line 112, and tuning element 118 may be straight (linear) traces of, e.g., electrical conductors, or may be non-linear and/or made of varying materials. One or more of the main transmission line 110, coupled line 112, and tuning element 118 may have bends or curves and may be helical, spiral, or C-shaped, for example. In particular embodiments, any or all of the main transmission line 110, coupled line 112, and tuning element 118 may be formed into inductor turns or may be patterned, e.g., mesh, sawtooth, etc. Various embodiments may include any suitable shaping and relative proximity to achieve the desired coupling factor range(s), filtering effect(s), and compensation for manufacturing variability.

Additionally, one or more of the main transmission line 110, coupled line 112, and tuning element 118 may be sectioned so as to have selectively adjustable length. For example, a suitable set of switches (e.g., FETs, MEMS) may interconnect various sections of transmission line, and a controller can be programmed to control the switches to selectively connect the various sections in multiple ways to form one or more main transmission lines 110, one or more coupled lines 112, and one or more tuning elements 118, to adjust to changing operational parameters or applications.

As discussed above, various embodiments of tunable couplers disclosed herein may be useful in a wide variety of electronic devices. Examples of such electronic devices can include, but are not limited to, consumer electronic products, parts of consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 9A:
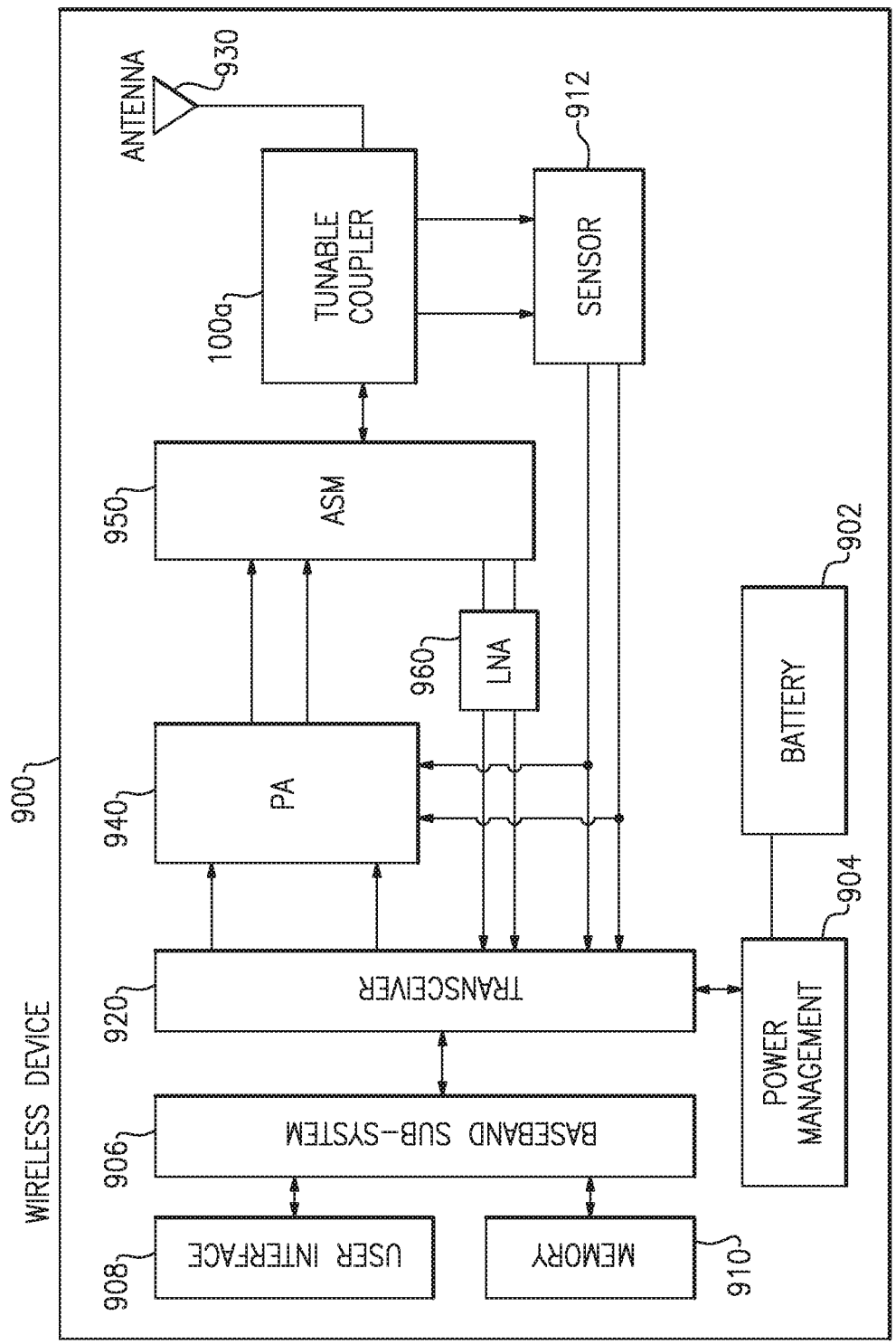
FIGS. 9A-9C are block diagrams of various examples of wireless devices that include a tunable coupler.
Figure 9B:
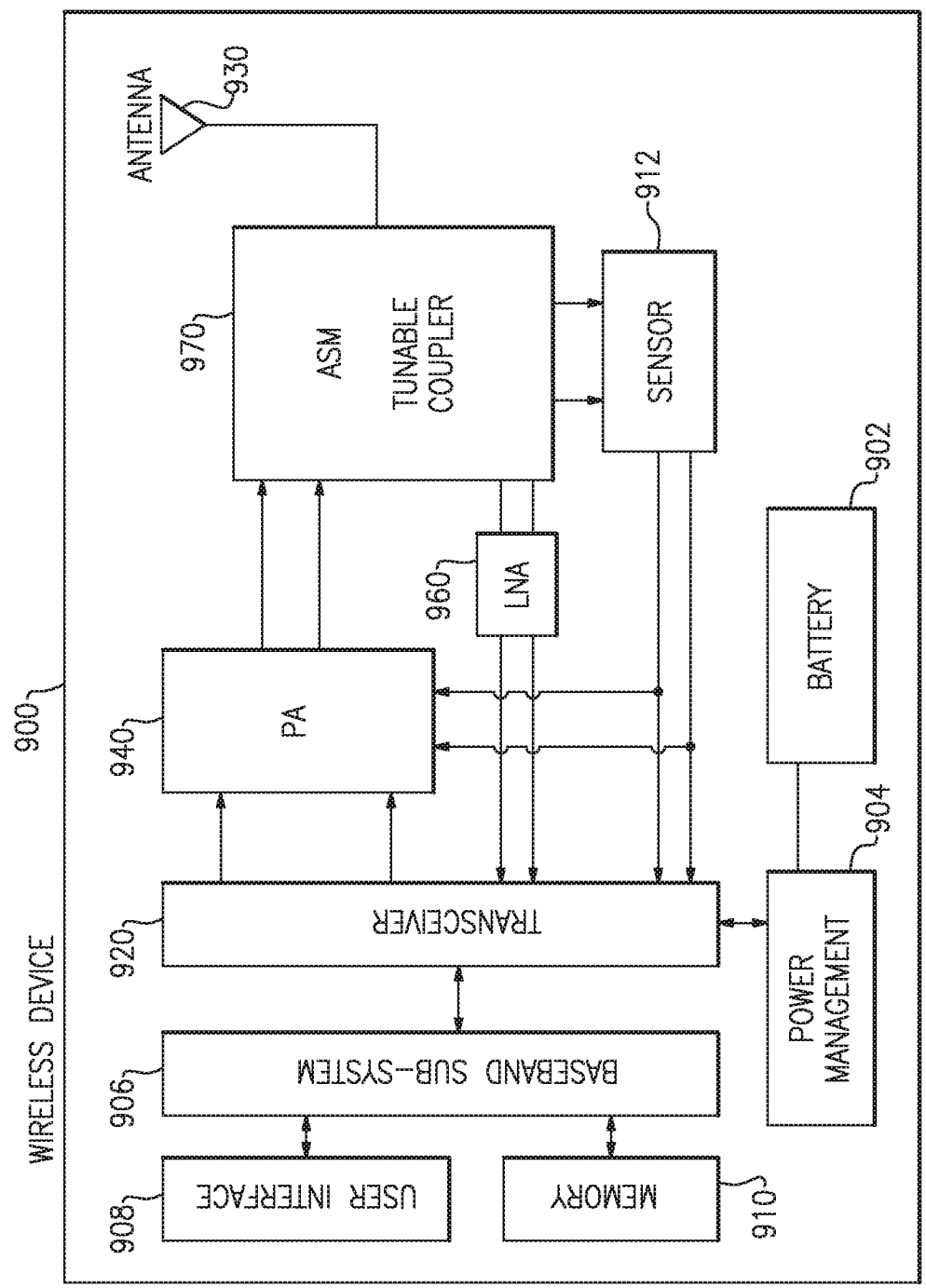
Figure 9C:
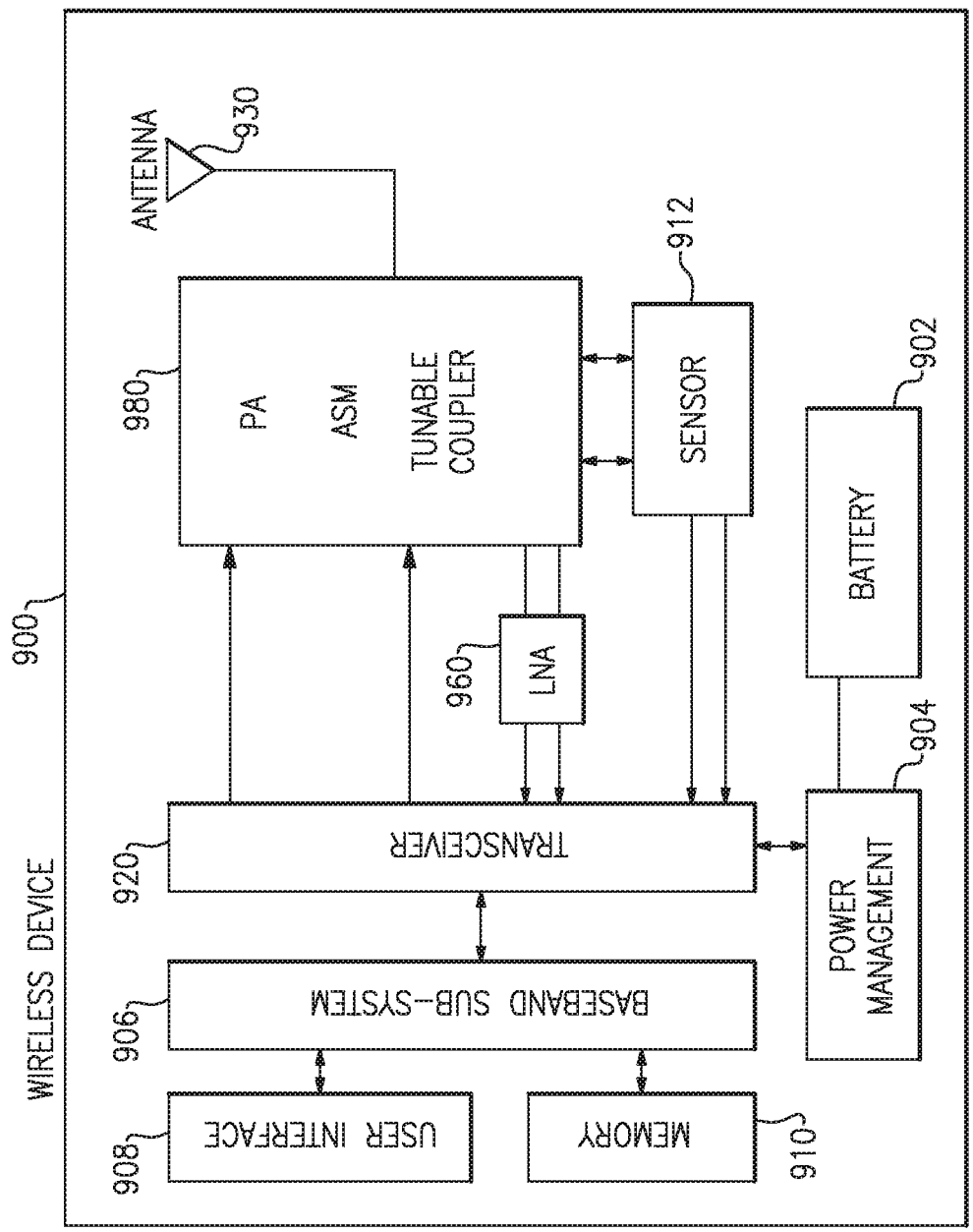

FIGS. 9A-9C illustrate examples of devices including a tunable EM coupler 100a according to various embodiments discussed above. The EM coupler 100a is configured to extract a portion of power of an RF signal traveling between a transceiver 920 and an antenna 930. In general, the EM coupler 100a is a bi-directional coupler. As illustrated, in the forward or transmit direction, a power amplifier 940 receives an EM signal, such as an RF signal, from the transceiver 920 and provides an amplified signal to the antenna 930 via an antenna switch module 950 and the EM coupler 100a. Similarly, in the receive direction, a received signal is provided from the antenna 930 to the transceiver 920 via the EM coupler 100a, the antenna switch module 950, and a low noise amplifier 960. Various additional elements may be included in a wireless device, such as the wireless device 900 of FIGS. 9A-9C, and/or in some embodiments a sub-combination of the illustrated elements may be implemented.

The power amplifier 940 amplifies an RF signal. The power amplifier 940 can be any suitable power amplifier. For example, the power amplifier 940 can include one or more of a single stage power amplifier, a multi-stage power amplifier, a power amplifier implemented by one or more bipolar transistors, or a power amplifier implemented by one or more field effect transistors. The power amplifier 940 can be implemented on a GaAs die, CMOS die, or a SiGe die, for example.

The antenna 930 can transmit the amplified signal, and receive signals. For example, in a cellular phone, wireless base station, or the like, the antenna 930 can transmit and receive RF signals to and from other devices. In alternate embodiments multiple antennas may be used.

Operating in the forward mode, the EM coupler 100a can extract a portion of the power of the amplified signal traveling between the power amplifier 940 and the antenna 930. The EM coupler 100a can generate an indication of forward power traveling from the power amplifier 940 to the antenna 930, for example. Operating in the reverse mode, the EM coupler 100a can generate an indication of reflected power traveling from the antenna 930 toward the power amplifier 940, or can extract a portion of the power of a signal received by the antenna 930 from an external source. In either mode, the EM coupler 100a may provide the signal portion to a sensor 912 that provides power feedback by measuring the power of the signal portion.

The examples of wireless device 900 of FIGS. 9A-9C further include a power management system 904 that is connected to the transceiver 920 that manages the power for the operation of the wireless device. The power management system 904 can also control the operation of a baseband sub-system 906 and other components of the wireless device 900. The power management system 904 may manage power within the wireless device 900 by, for example, providing power to the wireless device 900 from a battery 902 or providing power to the wireless device 900 from a power connector, and controlling a charge level of the battery 902 by controlling charge and discharge cycles and/or status of the battery 902.

In one embodiment, the baseband sub-system 906 is connected to a user interface 908 to facilitate various input and output of voice and/or data provided to and received from the user. The baseband sub-system 906 can also be connected to memory 910 that is configured to store data and/or instructions to facilitate operation of the wireless device 900, and/or to provide storage of information for the user.

The power amplifier 940 can be used to amplify a wide variety of RF or other frequency-band transmission signals. For example, the power amplifier 940 can receive an enable signal that can be used to pulse the output of the power amplifier to aid in transmitting a wireless local area network (WLAN) signal or any other suitable pulsed signal. The power amplifier 940 can be configured to amplify any of a variety of types of signal, including, for example, a Global System for Mobile (GSM) signal, a code division multiple access (CDMA) signal, a W-CDMA signal, a Long Term Evolution (LTE) signal, an EDGE signal, and the like. In certain embodiments, the power amplifier 940 and associated components including switches and the like can be fabricated on GaAs substrates using, for example, pHEMT or BiFET transistors, or on a Silicon substrate using CMOS transistors, as well as other semiconductor fabrication technologies.

Still referring to FIGS. 9A-9C, the wireless device 900 can also include a tunable coupler 100a having one or more directional EM couplers for measuring transmitted power signals from the power amplifier 940 and for providing one or more coupled signals to a sensor module 912. The sensor module 912 can in turn send information to the transceiver 920 and/or directly to the power amplifier 940 as feedback for making adjustments to regulate the power level of the power amplifier 940. In this way the tunable coupler 100a can be used to boost/decrease the power of a transmission signal having a relatively low/high power. It will be appreciated, however, that the tunable coupler 100a can be used in a variety of other implementations.

In certain embodiments of any of the examples of the wireless device 900, transmissions from the wireless device 900 may have prescribed power limits and/or time slots. The power amplifier 940 may shift power envelopes up and down within prescribed limits of power versus time. For instance, a particular mobile phone can be assigned a transmission time slot for a particular frequency channel. In this case the power amplifier 940 may be required to regulate the power level of one or more RF power signals over time, so as to prevent signal interference from transmission during an assigned receive time slot and to reduce power consumption. In such systems, the tunable coupler 100a can be used to measure the power of a power amplifier output signal to aid in controlling the power amplifier 940, as discussed above. The implementations shown in FIGS. 9A-9C are intended to be exemplary in nature only and non-limiting.

The example shown in FIG. 9B includes a combination module 970 that includes a tunable coupler in accord with aspects and embodiments described herein combined with an antenna switch module (e.g., ASM 950). The example shown in FIG. 9C includes a combination module 980 that incorporates a tunable coupler, an antenna switch module, and a power amplifier (e.g., PA 940) together as a front end module (module 980). Additional embodiments include a front end module that further incorporates one or more low noise amplifiers (e.g., LNA 960) and/or sensors (e.g., sensor 912).

Figure 10:
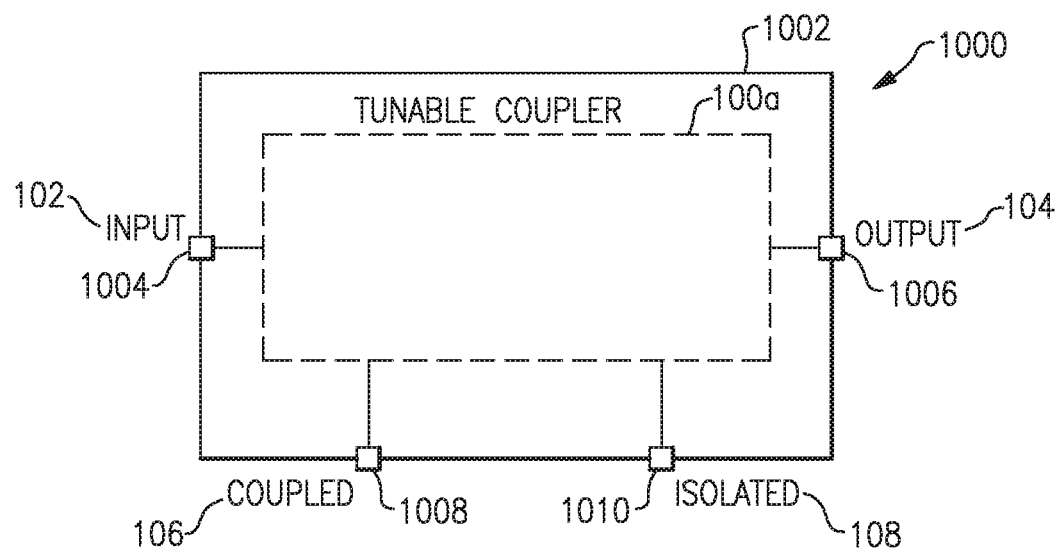
FIG. 10 is a block diagram of one example of a module including a tunable coupler.

Embodiments of the tunable coupler 100a described herein can be implemented in a variety of different modules including, for example, a stand-alone coupler module, a front-end module, a module combining the tunable coupler with an antenna switching network, an impedance matching module, an antenna tuning module, or the like. FIG. 10 illustrates one example of a coupler module that can include any of the embodiments or examples of the tunable coupler discussed herein.

FIG. 10 is a block diagram of one example of a module 1000 that includes an embodiment of the tunable coupler 100a. The module 1000 includes a substrate 1002 and may include various dies and may include packaging, such as, for example, an overmold to provide protection and facilitate easier handling. An overmold may be formed over substrate 1002 and dimensioned to substantially encapsulate the various dies and components thereon. The module 1000 may further include connectivity from the coupler 100a to the exterior of the packaging to provide signal interconnections, such as input port connection 1004, output port connection 1006, coupled port connection 1008, and isolation port connection 1010. The connections 1004, 1006, 1008, and 1010 maybe wirebonds or solder bumps, for example. Embodiments of the tunable coupler disclosed herein, optionally packaged into a module 1000, may be advantageously used in a variety of electronic devices as discussed above.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. An electromagnetic coupler with integrated frequency-dependent filtering, the electromagnetic coupler comprising:
    a first transmission line extending between an input port and an output port and configured to provide an output signal at the output port in response to receiving an input signal at the input port;
    a second transmission line disposed adjacent to the first transmission line and extending between a coupled port and an isolation port, the second transmission line configured to electromagnetically couple a portion of the input signal from the first transmission line onto the second transmission line to provide a coupled signal at the coupled port, an amplitude of the coupled signal being related to an amplitude of the input signal by a coupling factor;
    a tuning element electromagnetically coupled to at least one of the first transmission line and the second transmission line; and
    an adjustable impedance coupled between the tuning element and a reference node, the adjustable impedance including a reactive component, and a combination of the tuning element and the adjustable impedance being configured to filter a range of frequency components of the output signal.

2. The electromagnetic coupler of claim 1 wherein the adjustable impedance further includes an adjustable resistive component, the combination of the tuning element and the adjustable impedance being further configured to adjust the coupling factor.

3. The electromagnetic coupler of claim 2 wherein the adjustable resistive component includes a plurality of switchable resistors and the adjustable impedance further includes a plurality of switches configured to selectively connect one or more of the plurality of switchable resistors between the tuning element and the reference node to provide a selected impedance value for the adjustable impedance.

4. The electromagnetic coupler of claim 2 wherein the adjustable impedance includes a plurality of switches and a plurality of switchable impedance elements including at least one resistor and at least one of a capacitor and an inductor that together provide the reactive component and the adjustable resistive component, the plurality of switches configured to connect selected ones of the plurality of switchable impedance elements between the tuning element and the reference node to provide a selected impedance value for the adjustable impedance.

5. The electromagnetic coupler of claim 1 wherein the first transmission line, the second transmission line, and the tuning element are implemented in at least two layers of a laminate substrate, and wherein the second transmission line is laterally offset from at least one of the first transmission line and the tuning element.

6. The electromagnetic coupler of claim 5 wherein at least a portion of the second transmission line forms an overlapping region with at least one of the first transmission line and the tuning element.

7. The electromagnetic coupler of claim 1 wherein the adjustable impedance is tunable between a short circuit condition and an open circuit condition.

8. The electromagnetic coupler of claim 1 wherein the reactive component of the adjustable impedance is tunable to alter the range of frequency components filtered in the output signal.

9. An electromagnetic coupler implemented in a multi-layer substrate and comprising:
a first transmission line formed in the multi-layer substrate and extending between an input port and an output port;
a second transmission line formed in the multi-layer substrate and disposed adjacent to the first transmission line, the second transmission line extending between a coupled port and an isolation port and configured to provide a coupled signal at the coupled port in response to an input signal being received at the input port, an amplitude of the coupled signal being related to an amplitude of the input signal by a coupling factor;
a tuning element implemented in the multi-layer substrate and disposed adjacent at least one of the first transmission line and the second transmission line, the tuning element being electromagnetically coupled to the at least one of the first transmission line and the second transmission line; and
an adjustable impedance coupled between the tuning element and a reference node, a combination of the adjustable impedance and the tuning element being configured to adjust the coupling factor.

10. The electromagnetic coupler of claim 9 wherein the adjustable impedance includes a resistive component a reactive component, a combination of the tuning element and the adjustable impedance being configured to filter a range of frequency components of the output signal.

11. The electromagnetic coupler of claim 9 wherein at least a portion of the second transmission line forms an overlapping region in the multi-layer substrate with at least one of the first transmission line and the tuning element.

12. The electromagnetic coupler of claim 9 wherein the second transmission line is laterally offset from at least one of the first transmission line and the tuning element.

13. The electromagnetic coupler of claim 9 wherein the adjustable impedance is tunable between a short circuit condition and an open circuit condition.

14. An electronic device comprising:
an electromagnetic coupler implemented in a multi-layer substrate and including a first transmission line extending between an input port and an output port and a second transmission line disposed adjacent to the first transmission line and extending between a coupled port and an isolation port, the second transmission line being configured to provide a coupled signal at the coupled port in response to an input signal being received at the input port, an amplitude of the coupled signal being related to an amplitude of the input signal by a coupling factor;
a tuning element implemented in the multi-layer substrate and disposed adjacent at least one of the first transmission line and the second transmission line, the tuning element being electromagnetically coupled to the at least one of the first transmission line and the second transmission line;
an adjustable impedance coupled between the tuning element and a reference node, a combination of the adjustable impedance and the tuning element being configured to adjust the coupling factor; and
a transceiver coupled to the input port and configured to provide the input signal.

15. The electronic device of claim 14 wherein at least a portion of the second transmission line forms an overlapping region in the multi-layer substrate with at least one of the first transmission line and the tuning element.

16. The electronic device of claim 14 wherein the second transmission line is laterally offset from at least one of the first transmission line and the tuning element.

17. The electronic device of claim 14 wherein the adjustable impedance includes a resistive component and a reactive component, a combination of the tuning element and the adjustable impedance being configured to filter a range of frequency components of the output signal.

18. The electronic device of claim 14 wherein the adjustable impedance includes a plurality of switchable impedance elements including a resistor and at least one of a capacitor and an inductor and a plurality of switches configured to selectively connect one or more of the plurality of switchable impedance elements between the tuning element and the reference node to provide a selected impedance value for the adjustable impedance.

19. The electronic device of claim 14 further comprising a power amplifier connected between the transceiver and the input port, the power amplifier being configured to receive and amplify the input signal.

20. The electronic device of claim 18 further comprising a sensor module coupled to the coupled port and configured to detect a power level of the coupled signal, the sensor module being further coupled to at least one of the power amplifier and the transceiver and configured to provide a sensor signal representative of the power level of the coupled signal.

* * * * *